United States Patent
Wang et al.

(10) Patent No.: US 7,390,678 B2
(45) Date of Patent: Jun. 24, 2008

(54) METHOD FOR FABRICATING SEMICONDUCTOR DEVICE

(75) Inventors: Wensheng Wang, Kawasaki (JP); Takashi Ando, Machida (JP); Yukinobu Hikosaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/094,820

(22) Filed: Mar. 31, 2005

(65) Prior Publication Data

US 2005/0244988 A1    Nov. 3, 2005

Related U.S. Application Data

(63) Continuation of application No. PCT/JP03/04748, filed on Apr. 15, 2003.

(51) Int. Cl.
    *H01L 21/00* (2006.01)
(52) U.S. Cl. .................. 438/3; 438/556; 438/686; 257/E21.009; 257/E21.021; 257/E21.104; 257/E21.311; 257/E21.664
(58) Field of Classification Search .......... 438/3, 438/475, 513, 551, 552, 553, 556, 663, 680, 438/692, 706, 686
    See application file for complete search history.

(56) References Cited

U.S. PATENT DOCUMENTS

| | | | |
|---|---|---|---|
| 5,789,320 A * | 8/1998 | Andricacos et al. .......... | 438/678 |
| 6,309,894 B1 | 10/2001 | Miki et al. | |
| 6,485,988 B2 * | 11/2002 | Ma et al. .......................... | 438/3 |
| 6,495,413 B2 * | 12/2002 | Sun et al. ..................... | 438/240 |
| 6,548,343 B1 | 4/2003 | Summerfelt et al. | |
| 6,635,528 B2 * | 10/2003 | Gilbert et al. ............... | 438/253 |
| 6,682,944 B2 * | 1/2004 | Kikuchi et al. ................. | 438/3 |
| 6,710,422 B2 * | 3/2004 | Hikosaka et al. ............ | 257/520 |

(Continued)

FOREIGN PATENT DOCUMENTS

CN    1227669 A    9/1999

(Continued)

OTHER PUBLICATIONS

Korea 10-2005-7006076 Office Action dated Nov. 22, 2006.

(Continued)

*Primary Examiner*—David Nhu
(74) *Attorney, Agent, or Firm*—Westerman, Hattori, Daniels & Adrian, LLP.

(57) ABSTRACT

A PLZT film (30) is formed as the material film of a capacitor dielectric film and a top electrode film (31) is formed on the PLZT film (30). The top electrode film (31) comprises two $IrO_x$ films having different composition. Subsequently, back face of a semiconductor substrate (11) is cleaned and an Ir adhesion film (32) is formed on the top electrode film (31). Substrate temperature is set at 400° C. or above at that time. Thereafter, a TiN film and a TEOS film are formed sequentially as a hard mask. In such a method, carbon remaining on the top electrode film (31) after cleaning the back face is discharged into the chamber while the temperature of the semiconductor substrate (11) is kept at 400° C. or above in order to form the Ir adhesion film (32). Consequently, adhesion is enhanced between a TiN film being formed subsequently and the Ir adhesion film (32) thus preventing the TiN film from being stripped.

17 Claims, 10 Drawing Sheets

U.S. PATENT DOCUMENTS

| | | | |
|---|---|---|---|
| 6,713,342 B2 * | 3/2004 | Celii et al. | 438/239 |
| 6,773,930 B2 * | 8/2004 | Summerfelt et al. | 438/3 |
| 6,828,161 B2 * | 12/2004 | Summerfelt et al. | 438/3 |
| 6,876,021 B2 * | 4/2005 | Martin et al. | 257/295 |
| 6,902,939 B2 * | 6/2005 | Moise et al. | 438/3 |

FOREIGN PATENT DOCUMENTS

| | | |
|---|---|---|
| JP | 2001-244426 | 9/2001 |
| JP | 2003-59905 | 2/2003 |
| JP | 2003-59906 | 2/2003 |
| JP | 2003-92391 | 3/2003 |
| JP | 133292 | 5/2003 |
| KR | 2000-0042395 | 7/2000 |

OTHER PUBLICATIONS

Patent Abstracts of Japan, Publication No. 2001135798 A, published on May 18, 2001.

Chinese Office Action CN 03824759.3 dated Dec. 29, 2006.

* cited by examiner

METHOD FOR FABRICATING SEMICONDUCTOR DEVICE

This application is a continuation of PCT/JP03/06748 filed Apr. 15, 2003.

TECHNICAL FIELD

The present invention relates to a method for fabricating a semiconductor device suitable for the fabrication of a ferroelectric capacitor using simultaneous etching.

BACKGROUND ART

A ferroelectric memory (FeRAM) stores information by using the hysteresis characteristics of a ferroelectric material. In the ferroelectric memory, a ferroelectric capacitor having a ferroelectric film as a capacitor dielectric film between a pair of electrodes is formed in each memory cell. In a ferroelectric material, polarization occurs in accordance with the applied voltage between the electrodes, and spontaneous polarization remains even after the applied voltage is removed. Also, when the polarization of the applied voltage is inverted, the polarization of the spontaneous polarization is also inverted. Therefore, information can be read out by detecting the spontaneous polarization.

As in other semiconductor devices, it is necessary to reduce the cell area in the ferroelectric memory as well. The structures of the ferroelectric memory are roughly classified into a planar structure and a stack structure, and the cell area of the stack structure is smaller than that of the planar structure. In the stack structure, a capacitor is formed immediately on a plug which is formed on a drain of a field-effect transistor formed in each cell. That is, a barrier metal film, a bottom electrode, a ferroelectric film, and a top electrode are sequentially deposited immediately on a W plug.

The barrier metal film suppresses diffusion of oxygen from the upper layer to the W plug. As the material of the barrier metal film, a combination of TiN, Ir, $IrO_2$, Pt, and SRO (Sr-$RuO_3$) is used. Since, however, many materials of the barrier metal film can also function as the bottom electrode, it is impossible to clearly distinguish between the barrier metal film and the bottom electrode. An example of a structure combining the barrier metal film and the bottom electrode film is a structure in which an Ir film, a $IrO_2$ film, a Pt film, a PtO film, and a Pt film are sequentially stacked.

To meet demands on micropatterning of devices, it is favorable to etch the side surfaces of the films composing the capacitor into a substantially vertical shape having no slope. Examples of etching are a method of simultaneously etching these films, and a method of simultaneously etching the top electrode film and the ferroelectric film.

To form a ferroelectric capacitor having the stack structure by using simultaneous etching, etching using a hard mask is necessary. This is so because the selectivity between an organic resist mask and the ferroelectric film is low.

$SiO_2$, SiN, TiN, and the like are extensively used as the materials of the hard mask used in simultaneous etching. Of these materials, TiN is suited as an etching mask material for forming the ferroelectric capacitor, since TiN is hardly etched during etching using a gas formed by adding oxygen to halogen.

Unfortunately, in etching using a gas formed by adding oxygen to halogen, the etching rate significantly lowers when the ferroelectric film is etched. Therefore, the use of the gas as described above during etching of the ferroelectric film is unpreferable in respect of the throughput.

By contrast, the throughput increases when a hard mask having a layered structure in which an $SiO_2$ film is formed on a TiN film is formed, the $SiO_2$ film is used as a mask until the ferroelectric film is etched, and the TiN film is used as a mask when the bottom electrode film is etched.

Note that after the films forming the ferroelectric capacitor are deposited, the back surface (lower surface) of the wafer must be cleaned in order to remove the residue of the organic resist used when a contact hole and the like are formed.

Although the throughput increases when simultaneous etching using the hard mask having the layered structure as described above is performed, during the formation of TEOS (TetraEthylOrthoSilicate) film, peeling may occur between the top electrode film and hard mask over the entire surface of the wafer, or may occur in the bottom electrode film and barrier metal film on the edge of the wafer.

Also, omission of the capacitor may occur when simultaneous etching is performed or the hard mask is removed. That is, the top electrode, the capacitor dielectric film, and the like composing the capacitor sometimes completely disappears by peeling.

On the other hand, Japanese Patent Laid-Open No. 2001-135798 discloses a structure which uses a metal silicide layer as a wiring layer in contact with the top electrode, in order to suppress deterioration of the characteristics of the ferroelectric capacitor caused by annealing after a metal interconnection is formed. In the structure, a layered material of an $IrO_x$ film and an Ir film is used as the top electrode. Also, in the fabrication of a capacitor element, the top electrode film is patterned using lithography (resist mask) and dry etching, and the ferroelectric film and the bottom electrode film are patterned using lithography and dry etching after that.

In the conventional fabrication method, however, no simultaneous etching of the top electrode film, the ferroelectric film, and the bottom electrode film is performed, so the hard mask is necessary if the simultaneous etching is performed. Accordingly, the method cannot solve the problem of peeling as described above.

Patent reference 1
Japanese Patent Laid-Open No. 2001-135798

SUMMARY OF THE INVENTION

It is an object of the present invention to provide a method for fabricating a semiconductor device capable of suppressing film peeling.

The present inventors investigated the cause of peeling in the conventional fabrication methods, and found that carbon remains on the top electrode film even after the back surface (lower surface) of the wafer is cleaned, and this carbon causes peeling between the top electrode film and hard mask in the central portion of the wafer. The present inventors also found that the edge of the wafer has a portion where the $PtO_x$ film and $IrO_x$ film are in direct contact with each other, and peeling occurs from this portion if a relatively large stress acts on this portion during the fabrication.

For example, the present inventors analyzed, by TDS (Thermal Desertion Spectroscopy), two types of wafers having undergone back surface cleaning. That is, after back surface cleaning, one wafer was analyzed after being ashed in an oxygen ambient at 200° C. for 30 sec, and the other wafer was analyzed without performing the ashing process. FIGS. 1A and 1B show the results of the analysis. FIG. 1A is a graph showing the results of analysis on materials (for example, CO and $C_2H_4$) having a molecular weight of 28, and FIG. 1B is a graph showing the results of analysis on materials (for example, $CO_2$) having a molecular weight of 44. Referring to FIGS. 1A and 1B, symbol ♦ indicates the result of the wafer having undergone the ashing process, and ■ indicates the result of the wafer having undergone no ashing process.

As shown in FIGS. 1A and 1B, in the wafer having undergone no ashing process, the getting-out peak of a gas containing carbon clearly appeared near 350° C. By contrast, as shown in FIGS. 1A and 1B, in the wafer having undergone the ashing process, almost no getting-out peak of the carbon-containing gas appeared. These facts mean that even after back surface cleaning is performed, carbon remains on the surface of the wafer.

In addition, the present inventors observed the section of the edge of the wafer by using a scanning electron microscope (SEM). FIGS. 2A and 2B are views of SEM photographs each showing the section of the edge of the wafer. In the bottom electrode and the capacitor dielectric film, peeling occurred in the interface between the $IrO_x$ film and the PtO film. Also, in the top electrode and the hard mask, peeling occurred in the interface between the $IrO_x$ film as the top electrode and the TiN film composing the hard mask.

As shown in FIGS. 2A and 2B, when an $IrO_x$ film (thickness: 200 nm) was formed on a thermal oxide film ($SiO_2$ film) (FOX) and a TiN film and TEOS film were formed as a hard mask on the $IrO_x$ film, peeling occurred in the interface between the thermal oxide film and the $IrO_x$ film on the edge. This is presumably because not only the adhesion between the $IrO_x$ film and the TiN film was low, but also a relatively strong stress acted on the edge where the thickness of the $IrO_x$ film was as small as about 40 nm.

The present invention was made on the basis of the above experimental results and findings.

In a method for fabricating a semiconductor device according to the present invention, a ferroelectric film is formed, above a semiconductor substrate, as a material film of a capacitor dielectric film of a ferroelectric capacitor. Then, on the ferroelectric film, a top electrode film is formed as a material film of a top electrode of the ferroelectric capacitor. Subsequently, a mask adhesion film containing a noble metal element is formed on the top electrode film. After that, a hard mask is formed on the mask adhesion film. The top electrode film and the ferroelectric film are etched by using the hard mask.

DETAILED DESCRIPTION OF THE PREFERRED EMBODIMENTS

Figure 3:
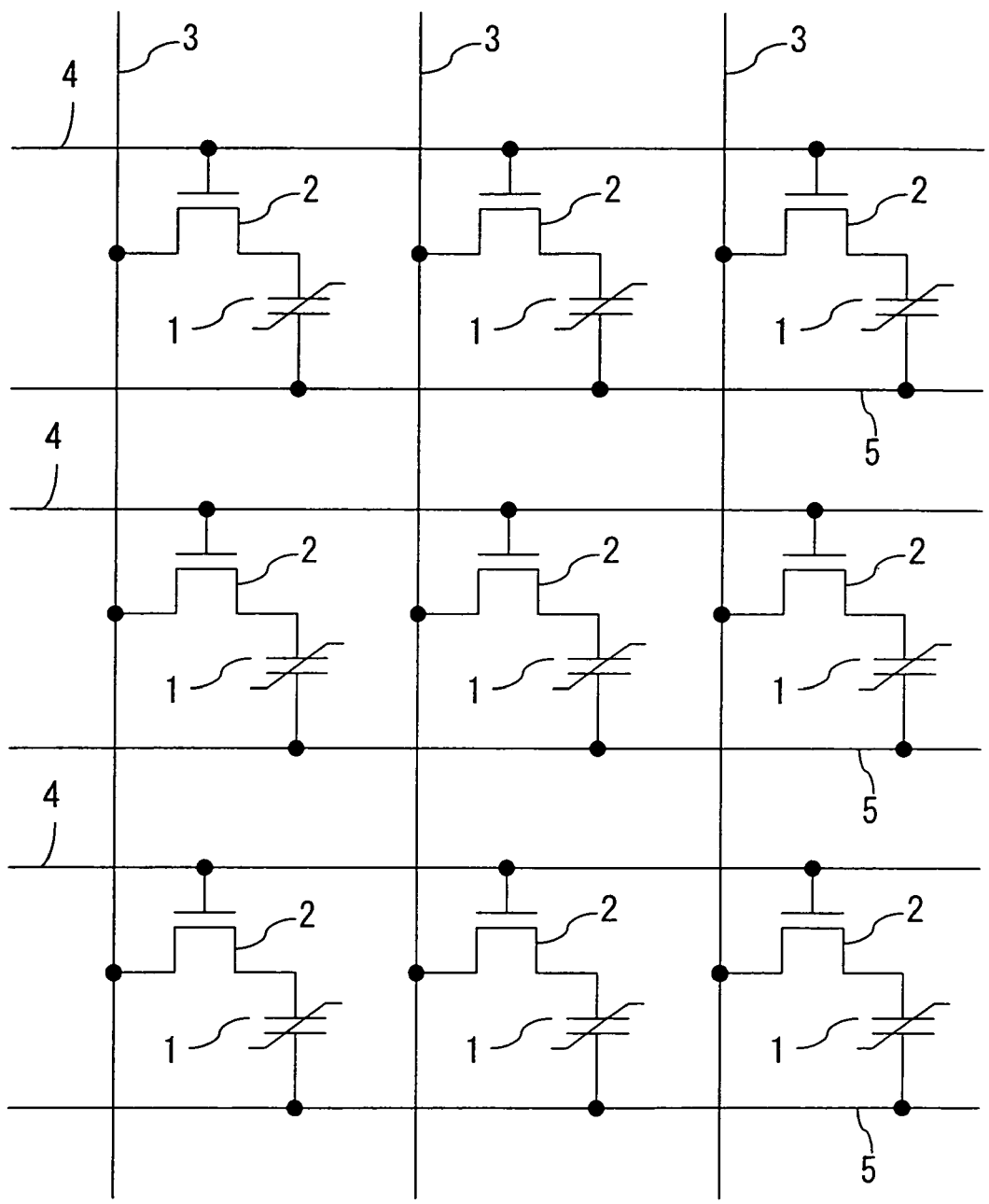
FIG. 3 is a circuit diagram showing the arrangement of a memory cell array of a ferroelectric memory (semiconductor device) fabricated by a method according to an embodiment of the present invention.

Embodiments of the present invention will be described in detail below with reference to the accompanying drawings. FIG. 3 is a circuit diagram showing the arrangement of a memory cell array of a ferroelectric memory (semiconductor device) fabricated by a method according to an embodiment of the present invention.

This memory cell array includes a plurality of bit lines 3 running in one direction, and a plurality of word lines 4 and plate lines 5 running in a direction perpendicular to the direction in which the bit lines 3 run. In addition, memory cells of the ferroelectric memory are arranged in the form of an array so as to match the lattice formed by the bit lines 3, word lines 4, and plate lines 5. A ferroelectric capacitor 1 and MOS transistor 2 are formed in each memory cell.

The gate of the MOS transistor 2 is connected to the word line 4. One of the source and drain of the MOS transistor 2 is connected to the bit line 3, and the other of the source and drain is connected to one electrode of the ferroelectric capacitor 1. The other electrode of the ferroelectric capacitor 1 is connected to the plate line 5. Note that each word line 4 and each plate line 5 are shared by a plurality of MOS transistors 2 arranged in the same direction as the direction in which these lines run. Similarly, each bit line 3 is shared by a plurality of MOS transistors 2 arranged in the same direction as the direction in which the bit line 3 runs. The direction in which the word lines 4 and plate lines 5 run and the direction in which the bit lines 3 run are sometimes called a row direction and column direction, respectively.

In the memory cell array of the ferroelectric memory having the above arrangement, data is stored in accordance with the polarization state of a ferroelectric film formed in the ferroelectric capacitor 1.

First Embodiment

Figure 1A:
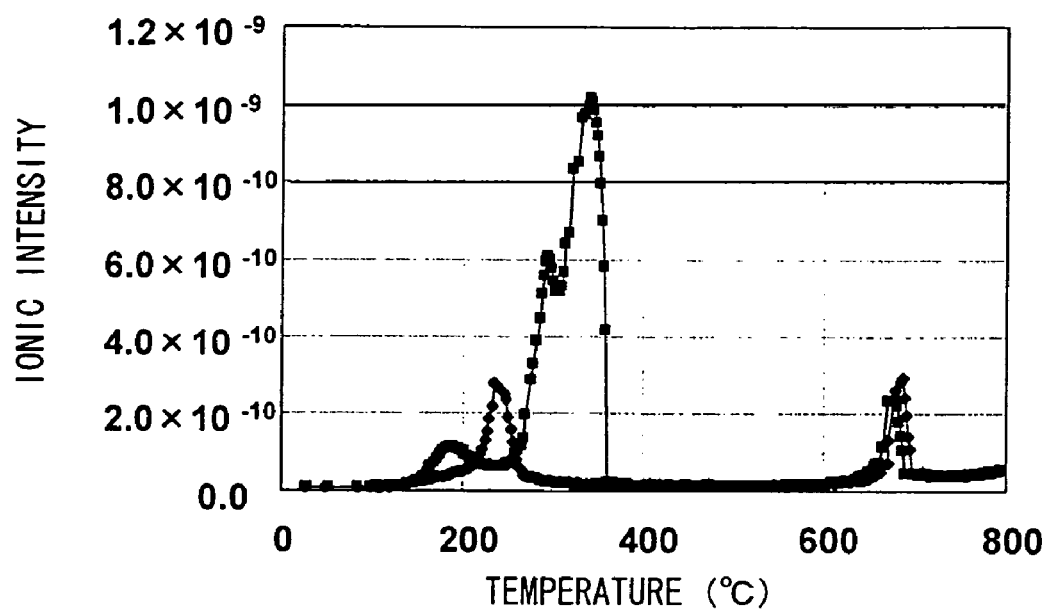
FIG. 1A is a graph showing the results of analysis on materials having a molecular weight of 28.
Figure 1B:
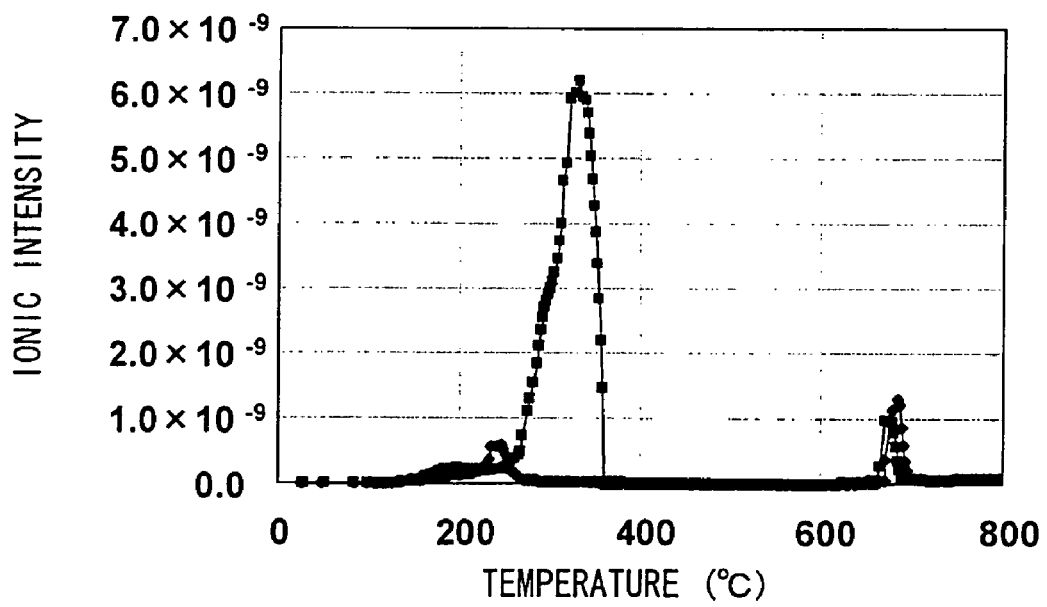
FIG. 1B is a graph showing the results of analysis on materials having a molecular weight of 44.
Figure 2A:
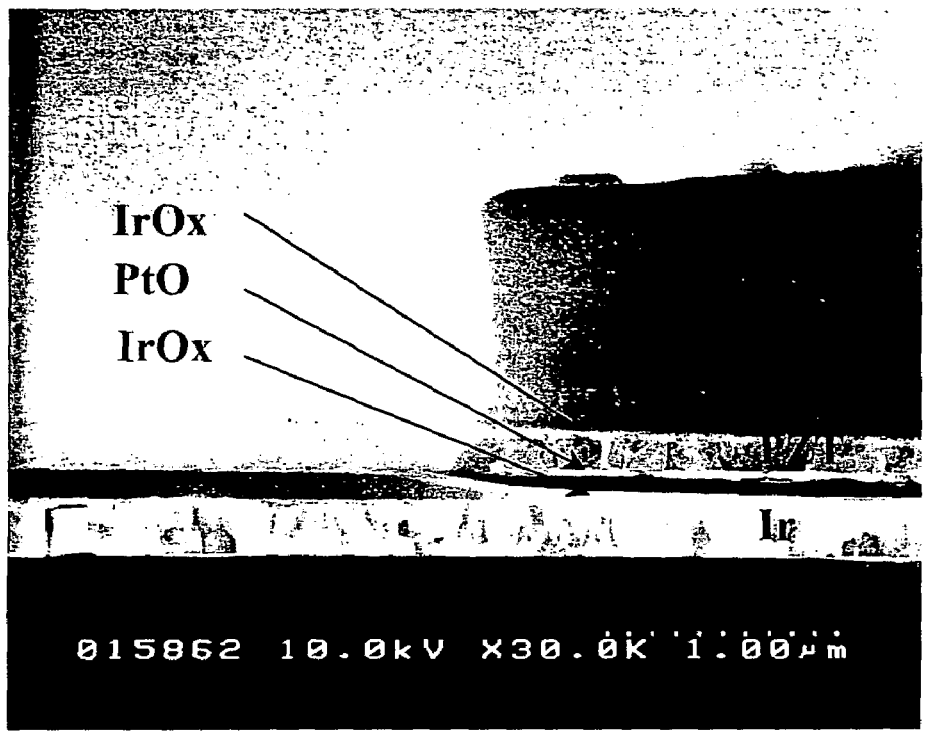
FIGS. 2A and 2B are views of SEM photographs each showing the section of the edge of a wafer.
Figure 2B:
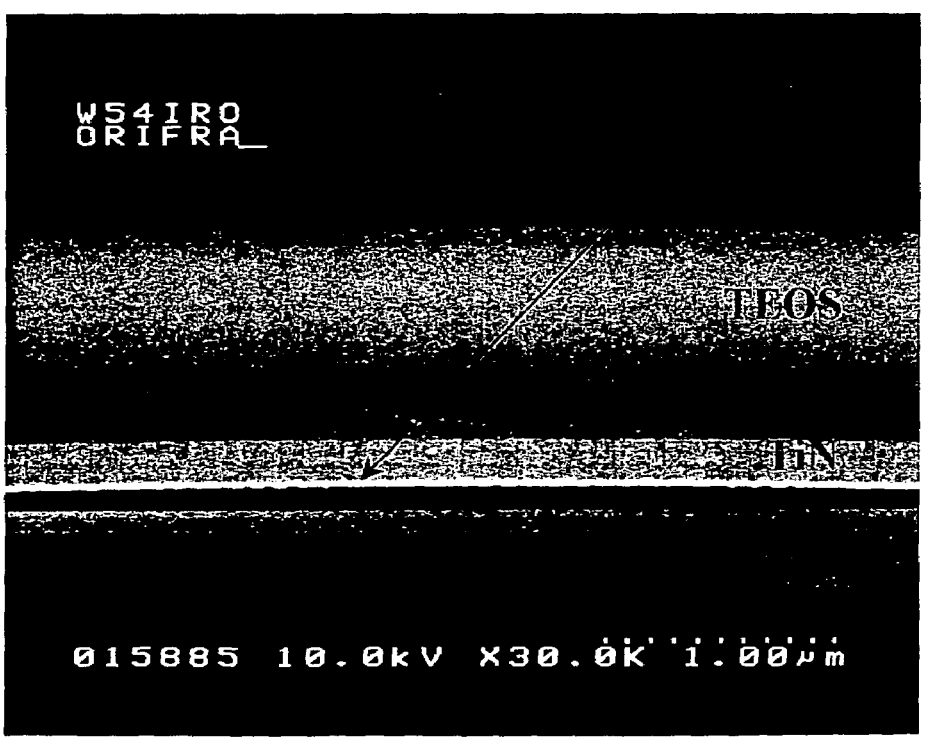

A first embodiment of the present invention will be described below. FIGS. 4A to 4E are sectional views showing, in the order of steps, a method for fabricating a ferroelectric memory (semiconductor device) according to the first embodiment of the present invention. Note that FIGS. 4A to 4E show sections perpendicular to the direction in which the bit lines 3 run. Note also that each of FIGS. 4A to 4E illustrates a portion corresponding to two MOS transistors sharing one bit line (corresponding to the bit line 3 in FIG. 1).

Figure 4A:
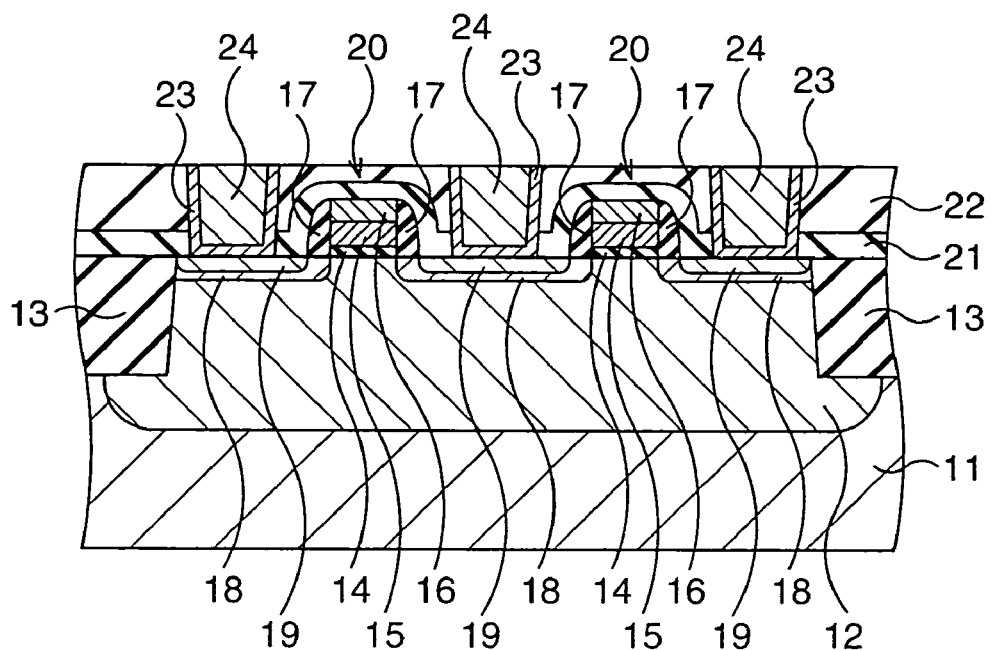
FIGS. 4A to 4E are sectional views showing, in the order of steps, a method for fabricating a ferroelectric memory (semiconductor device) according to a first embodiment of the present invention.

In the first embodiment, as shown in FIG. 4A, a well 12 is first formed in a surface of a semiconductor substrate 11 such as a silicon substrate. Then, element isolation regions 13 are formed in the surface of the semiconductor substrate 11 by, for example, STI (Shallow Trench Isolation). Subsequently, gate insulating films 14, gate electrodes 15, cap films 16, side walls 17, source/drain diffusion layers 18, and silicide layers 19 are formed on the surface of the well 12, thereby forming MOS transistors 20 as switching elements. The MOS transistors 20 correspond to the MOS transistors 2 in FIG. 3. Note that although each MOS transistor 20 has two source/drain diffusion layers 18 for a source and drain, one of them is shared by the two MOS transistors 20.

Then, a silicon oxynitride film 21 is formed on the entire surface to cover the MOS transistors 20, and an $SiO_2$ film 22 is formed as an interlayer dielectric film on the entire surface and planarized by CMP (Chemical Mechanical Polishing), for example. The silicon oxynitride film 21 is formed to prevent hydrogen deterioration of the gate insulating films 14 and the like when the $SiO_2$ film 22 is formed. After that, contact holes reaching the silicide layers 19 are formed in the SiO$_2$ film 22 and the silicon oxynitride film 21, thereby opening plug contact portions. After a glue film 23 is formed in each contact hole, a W film is buried by a CVD method, for example, and planarized by CMP to form a W plug 24.

Figure 4B:
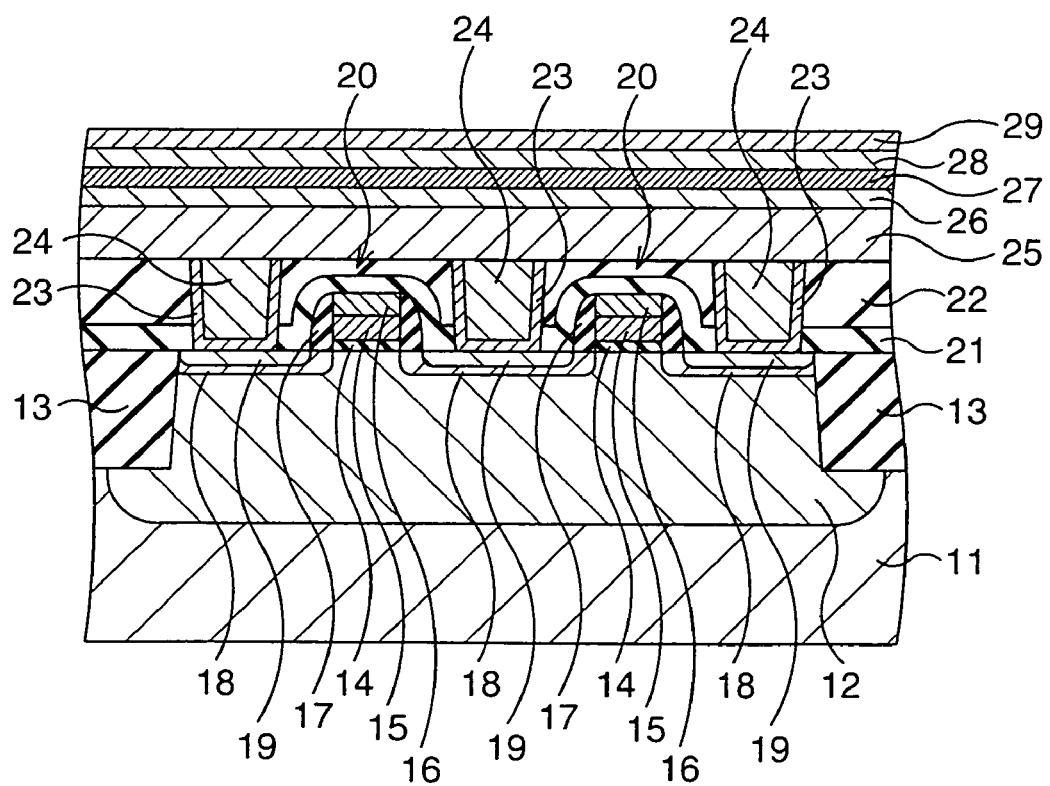

Subsequently, as shown in FIG. 4B, an Ir film 25 is formed on the SiO$_2$ film 22 by sputtering. The conditions are, for example, a substrate temperature of 500° C., a film formation power of 1 kW, an Ar gas flow rate of 100 sccm, a chamber internal pressure of 0.35 Pa, and a film formation time of 176 sec. As a consequence, an Ir film 25 about 250 nm thick is obtained.

An IrO$_x$ film 26 is then formed on the Ir film 25 by sputtering. The conditions are, for example, a substrate temperature of 50° C., a film formation power of 1 kW, an Ar gas flow rate of 60 sccm, an O$_2$ gas flow rate of 60 sccm, a chamber internal pressure of 0.37 Pa, and a film formation time of 10 sec. Consequently, an IrO$_x$ film 26 about 28 nm thick is obtained.

A Pt film 27 is formed on the IrO$_x$ film 26 by sputtering. The conditions are, for example, a substrate temperature of 350° C., a film formation power of 1 kW, an Ar gas flow rate of 100 sccm, a chamber internal pressure of 0.38 Pa, and a film formation time of 8 sec. Consequently, a Pt film 27 about 15 nm thick is obtained. In the formation of the Pt film 27, a clamp ring is used in order to prevent the Pt film 27 and the semiconductor substrate (silicon substrate) 11 from reacting with each other in direct contact with each other. For this reason, the edge of the semiconductor substrate 11 has a portion where the Pt film 27 is not formed.

After that, a PtO$_x$ film 28 is formed on the Pt film 27 by sputtering. The conditions are, for example, a substrate temperature of 350° C., a film formation power of 1 kW, an Ar gas flow rate of 36 sccm, an O$_2$ gas flow rate of 144 sccm, a chamber internal pressure of 6.2 Pa, and a film formation time of 22 sec. As a consequence, a PtO$_x$ film 28 about 25 nm thick is formed. Note that the edge of the semiconductor substrate 11 has the portion where the Pt film 27 is not formed, so the PtO film 28 is formed on the IrO$_x$ film 26 in that portion.

Then, a Pt film 29 is formed on the PtO$_x$ film 28 by sputtering. The conditions are, for example, a substrate temperature of 100° C., a film formation power of 1 kW, an Ar gas flow rate of 100 sccm, a chamber internal pressure of 0.4 Pa, and a film formation time of 32 sec. As a consequence, a Pt film 29 about 50 nm thick is formed.

The Ir film 25, the IrO$_x$ film 26, the Pt film 27, the PtO$_x$ film 28, and the Pt film 29 compose a barrier metal film and a bottom electrode film together.

Note that the Ir film 25 and the IrO$_x$ film 26 can be formed by using the same chamber, and the Pt film 27, the PtO$_x$ film 28, and the Pt film 29 can be formed by using the same chamber.

These films are then rapidly thermal-annealed in an Ar atmosphere at, for example, 750° C. for 60 sec, thereby crystallizing the Pt films 27 and 29.

Figure 4C:
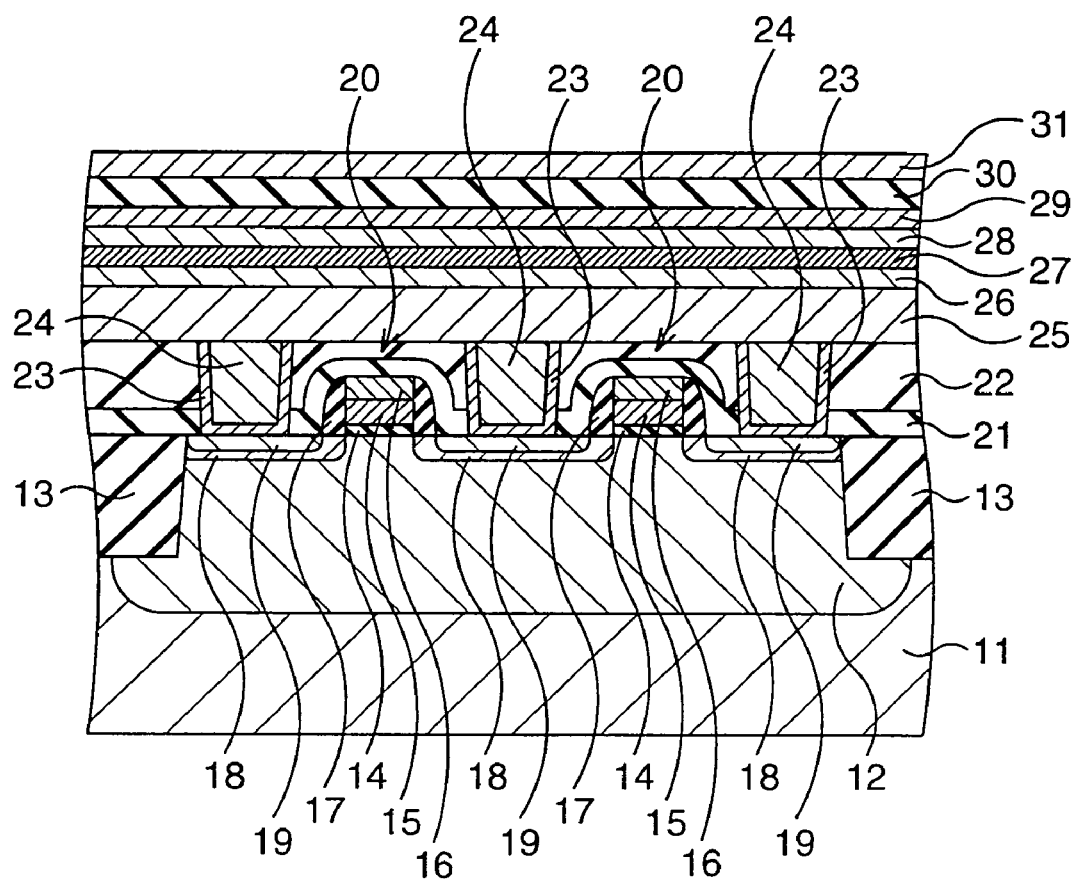

Then, as shown in FIG. 4C, a PLZT ((Pb,La)(Zr,Ti)O$_3$) film 30 is formed on the Pt film 29 by sputtering, and crystallized by annealing. Although the PLZT film may also be formed by a MOCVD method, for example, the arrangement of the bottom electrode is desirably changed if the MOCVD method is to be used.

After that, a top electrode film 31 is formed on the PLZT film 30 by sputtering. The top electrode film 31 is made up of two IrO$_x$ films, for example, having different compositions. The first IrO$_x$ film is formed, at, for example, room temperature as a substrate temperature, a film formation power of 2 kW, an Ar gas flow rate of 100 sccm, and an O$_2$ gas flow rate of 59 sccm. The first IrO$_x$ film is about 50 nm thick, for example. After the first IrO$_x$ film is formed, annealing is performed, and then the second IrO$_x$ film is formed. The second IrO$_x$ film is about 75 to 125 nm thick, for example.

Subsequently, the back surface (lower surface) of the semiconductor substrate (wafer) 11 is cleaned.

An Ir adhesion film (mask adhesion film) 32 is formed on the top electrode film 31 by sputtering. The conditions are, for example, a substrate temperature of 400° C. or more, an Ar gas flow rate of 100 sccm, a film formation power of 1 kW, and a film formation time of 7 sec. Consequently, an Ir adhesion film 32 about 10 nm thick is formed. In the formation of the Ir adhesion film 32, film formation is started after the semiconductor substrate 11 is held on a wafer stage set at 400° C. for 30 sec. This is to stabilize the substrate temperature.

Figure 4D:
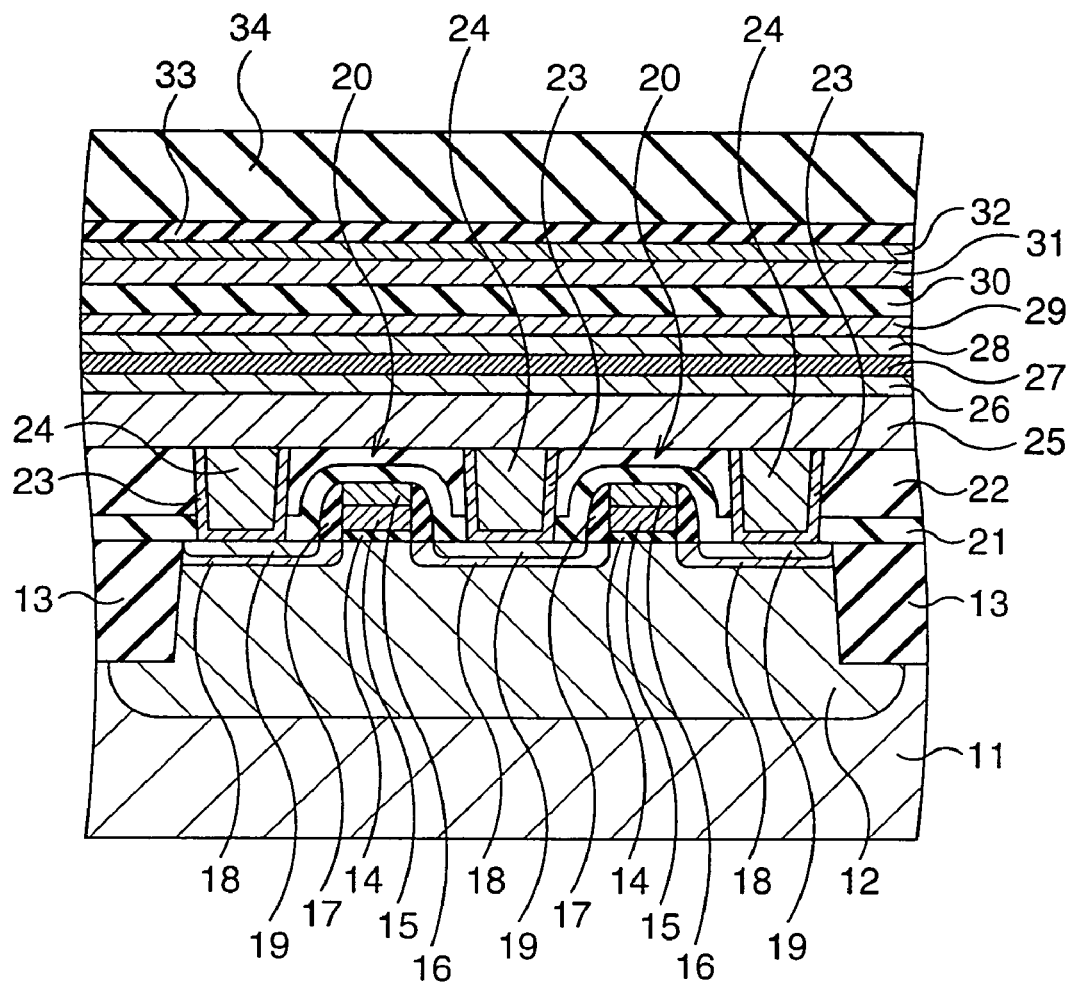

After the Ir adhesion film 32 is formed, as shown in FIG. 4D, a TiN film 33 and a TEOS film 34 to be used as a hard mask when the top electrode film 31, the PLZT film 30, the Pt film 29, the PtO$_x$ film 28, the Pt film 27, the IrO$_x$ film 26, and the Ir film 25 are patterned are sequentially formed. The TiN film 33, for example, is formed at 200° C., and has a thickness of about 200 nm. The TEOS film 34, for example, is formed at 390° C., and has a thickness of about 390 nm.

Then, the TEOS film 34 and the TiN film 33 are patterned to form a hard mask only in a region where a stack type ferroelectric capacitor is to be formed.

Figure 4E:
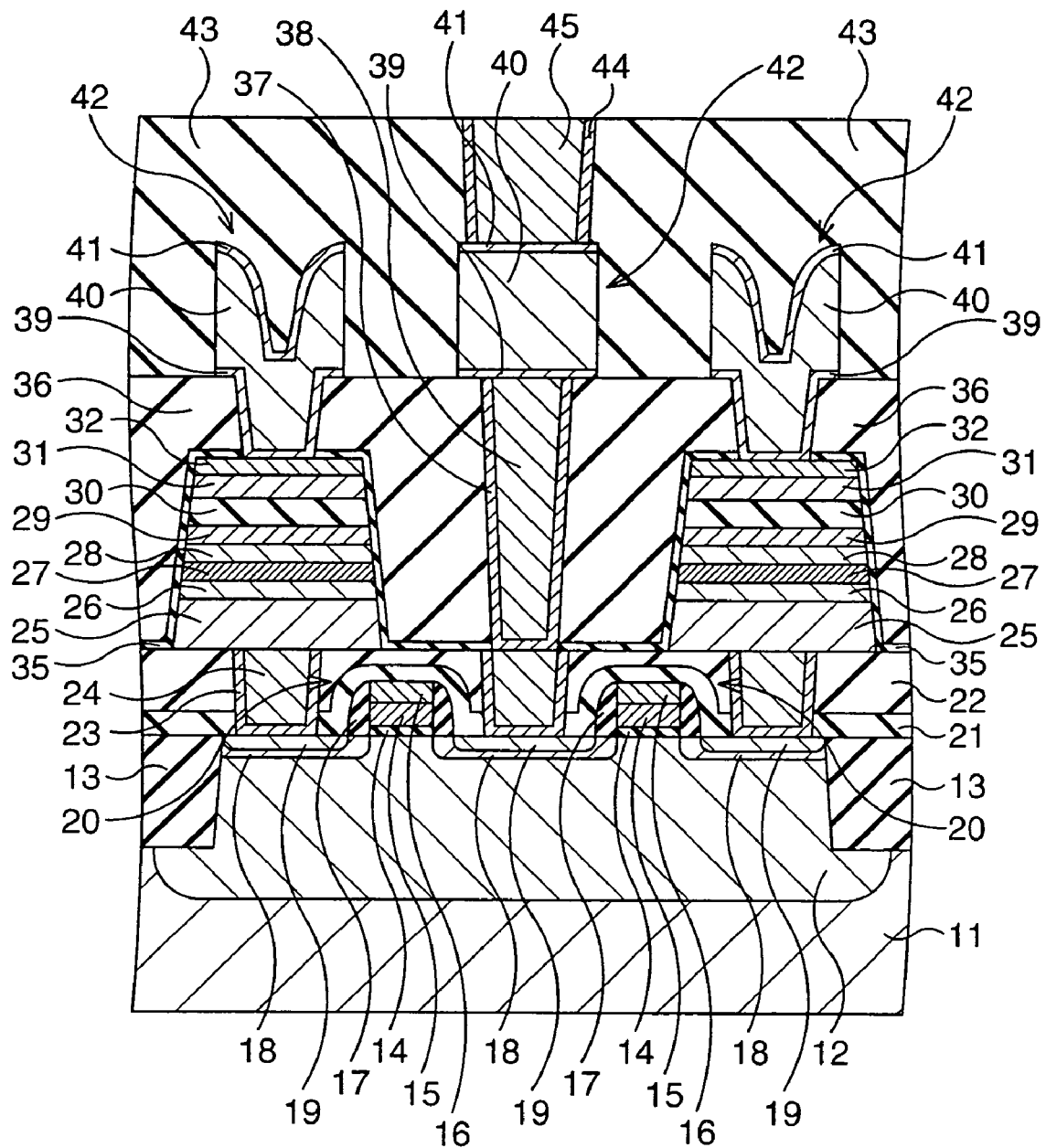

As shown in FIG. 4E, patterning and etching using the TEOS film 34 and the TiN film 33 as a hard mask are used to simultaneously process the top electrode film 31, the PLZT film 30, the Pt film 29, the PtO$_x$ film 28, the Pt film 27, the IrO$_x$ film 26, and the Ir film 25, thereby forming ferroelectric capacitors having the stack structure. These ferroelectric capacitors correspond to the ferroelectric capacitors 1 in FIG. 3.

After that, the hard mask (TEOS film 34 and TiN film 33) is removed. Subsequently, recovery annealing is performed to recover damages to the PLZT film 30 caused by the film formation, the etching process and the like.

An alumina film 35 is formed on the entire film as a protective film which protects the ferroelectric capacitors from process damage. An interlayer dielectric film 36 is then formed on the entire surface, and planarized by CMP.

After that, a contact hole reaching the W plug 24 is formed in the interlayer dielectric film 36 and the alumina film 35 by patterning and etching. After a glue film 37 is formed in this contact hole, a W film is buried and planarized by CMP, thereby forming a W plug 38.

Then, a W anti-oxidation dielectric film (not shown) is formed on the entire surface. As the W anti-oxidation dielectric film, an SiON film or the like is used. Contact holes reaching the Ir adhesion film 32 are formed in the W anti-oxidation dielectric film and interlayer dielectric film 36 by patterning and etching. Subsequently, annealing is performed to recover damages caused by etching. After this annealing, the W anti-oxidation dielectric film is removed by etch back.

A lower glue film 39, a wiring material layer 40, and an upper glue film 41 are sequentially deposited.

An antireflection film (not shown) is formed on the glue film 41, and a resist film (not shown) is formed by coating. After that, the resist film is processed to match the wiring pattern, and the processed resist film is used as a mask to etch the antireflection film, glue film 41, interconnecting material film 40, and glue film 39. As the antireflection film, an SiON film, for example, is used. By this etching, as shown in FIG. 4E, wirings 42 made up of the glue film 41, the wiring material film 40, and the glue film 39 having a predetermined planar shape are obtained.

After that, further, formation of an interlayer dielectric film 43, burying of a glue film 44 and W plug 45 into a contact hole, formation of wirings from the second lowest one, and the like are performed. Then, a cover film made up of, for example, a TEOS film and an SiN film is formed to complete the ferroelectric memory having the ferroelectric capacitors. Note that the upper wirings are formed such that the wiring 42 connected to the top electrode film 31 via the Ir adhesion film 32 is connected to the plate line, and the wiring 42 connected to the source/drain diffusion layer 18 shared by the two MOS transistors 20 is connected to the bit line. The gate electrode 15 may also be used as a word line itself, and may also be connected to the word line in the upper wiring.

In the first embodiment as described above, while the temperature of the semiconductor substrate 11 is held at 400° C. or more in the formation of the Ir adhesion film 32, carbon remaining on the top electrode film 31 after the back surface is cleaned is discharged into the chamber. This increases the adhesion between the TiN film 33 to be formed later and the Ir adhesion film 32, and prevents easy peeling of the TiN film 33.

Also, the formation of the Ir adhesion film 32 does not require the clamp ring which is necessary when the Pt film is formed. Accordingly, the Ir adhesion film 32 can be formed over the entire surface of the semiconductor substrate 11. In addition, the film formation temperature of the Ir adhesion film 32 is 400° C., and the internal stress of the Ir film formed at this temperature is extremely low. Since this also lowers the stress acting on each film already formed, no peeling occurs between the $IrO_x$ film 26 and the $PtO_x$ film 28 even if they are in direct contact with each other.

When the present inventors actually formed a hard mask in the same manner as in the first embodiment, favorable results were obtained. The contents will be explained below. Also, for comparison with the first embodiment (Example No. 1), Example Nos. 2 and 3 and Comparative Example Nos. 4 and 5 were evaluated following the same procedure as in Example No. 1.

In Example No. 2, after back surface cleaning was performed, ashing was performed in an oxygen atmosphere at 200° C. for 2 min, and then a hard mask (TEOS film/TiN film) was formed.

In Example No. 3, after a TiN film was formed in the same manner as in Example No. 2, a 3-mm ring-like portion was removed from the edge of the semiconductor substrate 11 by cutting. Subsequently, a TEOS film was formed.

In Comparative Example No. 4, after back surface cleaning was performed, a hard mask was immediately formed. This method was the same as the conventional method.

In Comparative Example No. 5, after back surface cleaning was performed, a TiN film was formed, and a TEOS film was formed under a high film formation power at a film formation temperature of 340° C.

The occurrence of peeling in the central portion and on the edge of each semiconductor substrate (wafer) of each of these samples was evaluated. The results are shown in Table 1. In Table 1, the denominator is the number of semiconductor substrates having undergone the check, and the numerator is the number of semiconductor substrates in which peeling occurred.

As shown in Table 1, no peeling occurred in the central portions in Example Nos. 1 to 3. However, peeling occurred on the edges in Example No. 2. Also, Example No. 3 suppressed peeling, but increased the number of steps compared to Example No. 1.

By contrast, in Comparative Example Nos. 4 and 5, peeling occurred in the central portions and on the edges.

Second Embodiment

Figure 5:
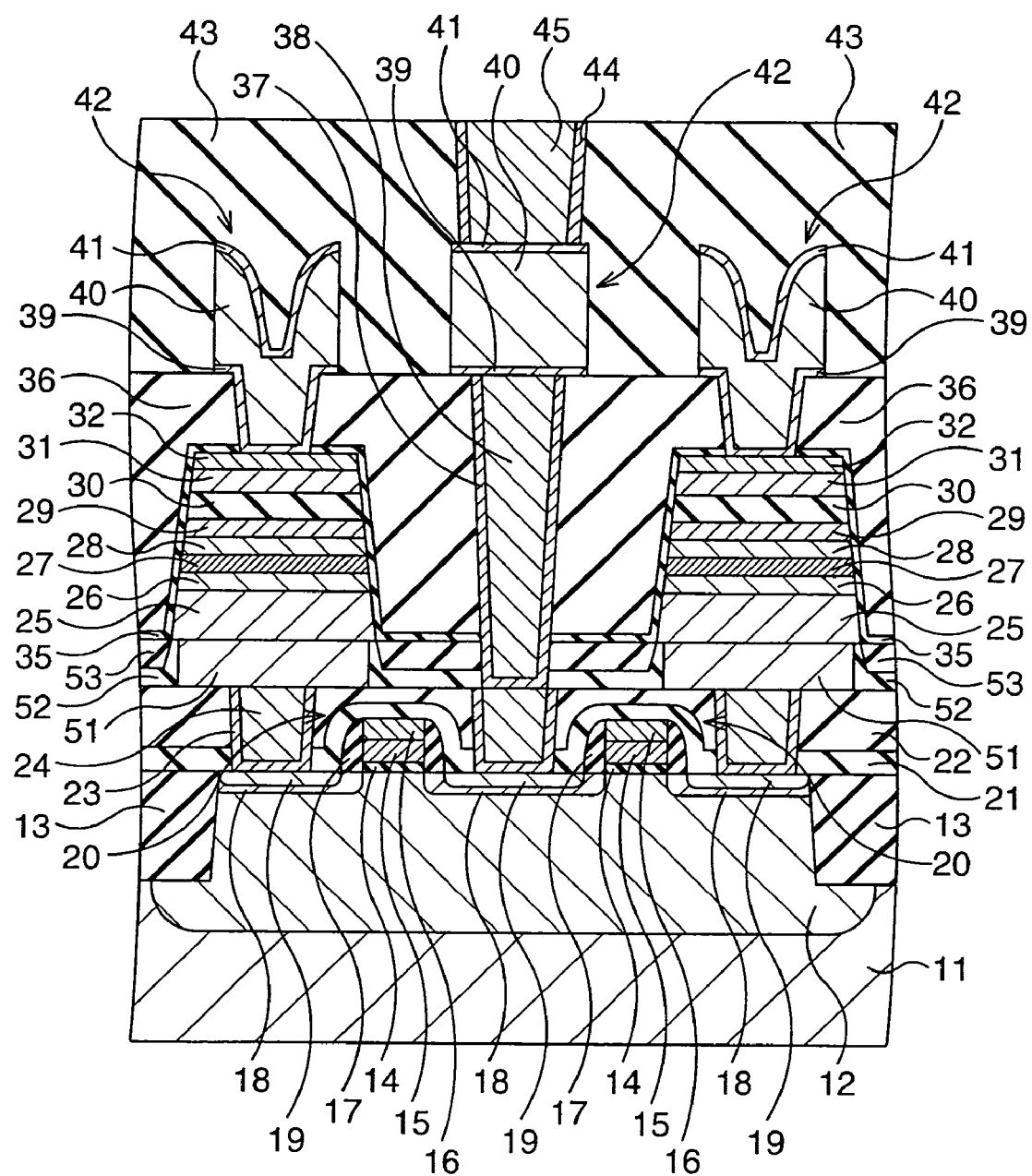
FIG. 5 is a sectional view showing a method for fabricating a ferroelectric memory (semiconductor device) according to a second embodiment of the present invention.

A second embodiment of the present invention will be described next. FIG. 5 is a sectional view showing a method for fabricating a ferroelectric memory (semiconductor device) according to the second embodiment of the present invention. Note that FIG. 5 shows a section perpendicular to the direction in which the bit lines 3 run.

In the second embodiment, as shown in FIG. 5, processing from the formation of a well 12 to the formation of W plugs 24 is first performed in the same manner as in the first embodiment.

Then, an Ir film having a thickness of, for example, 400 nm is formed on the entire surface. This Ir film is patterned by the patterning and etching techniques to selectively form barrier metal films 51 on the W plugs 24 to be connected to bottom electrodes of ferroelectric capacitors.

After that, a W anti-oxidation film 52 which prevents oxidation of the W plugs 24 and functions as an etching stopper when a bottom electrode film, a ferroelectric film, and a top electrode film to be formed in subsequent steps are etched is formed on the entire surface, and a capacitor adhesion film 53 having high adhesion to a bottom electrode film is formed on the W anti-oxidation film 52. As a W anti-oxidation film 52, an SiN film or SiON film having a thickness of about 100 nm is formed, for example. As the capacitor adhesion film 53, a TEOS film having a thickness of about 800 nm is formed, for example.

Subsequently, CMP is performed using the barrier metal film 51 as a stopper. Note that the capacitor adhesion film 53 also contributes to prevention of oxidation of the W plugs 24.

Processing from the formation of an Ir film 25 is performed in the same manner as in the first embodiment, thereby completing the ferroelectric memory having ferroelectric capacitors. Note that in this embodiment, the barrier metal film 51 is formed below the Ir film 25, so the thickness of the Ir film 25 is, for example, 30 nm, which is smaller than that in the first embodiment.

In the second embodiment as described above, the same effects as in the first embodiment are obtained, and the existence of the barrier metal film 51, the W anti-oxidation film 52, and the capacitor adhesion film 53 further prevents oxidation of the W plugs 24.

When the present inventors actually formed a hard mask in the same manner as in the second embodiment, favorable results were obtained. The contents will be explained below. Also, for comparison with the second embodiment (Example No. 11), Example No. 12 and Comparative Example No. 13 were evaluated following the same procedure as in Example No. 11.

In Example No. 12, after back surface cleaning was performed, ashing was performed in an oxygen atmosphere at 200° C. for 2 min, and then a TiN film was formed. In the same manner as in Example No. 3, a 3-mm ring-like portion was removed from the edge of a semiconductor substrate 11 by cutting. Subsequently, a TEOS film was formed.

In Comparative Example No. 13, after back surface cleaning was performed, a hard mask was immediately formed as in Comparative Example No. 4. This method was the same as the conventional method.

The occurrence of peeling in the central portion and on the edge of each semiconductor substrate (wafer) of each of these samples was evaluated. The results are shown in Table 2. In Table 2, the denominator is the number of semiconductor substrates having undergone the check, and the numerator is the number of semiconductor substrates in which peeling occurred.

As shown in Table 2, no peeling occurred in the central portions in Example Nos. 11 to 12. In Example No. 12, however, although peeling was suppressed, the number of steps was increased compared to Example No. 11.

By contrast, in Comparative Example No. 13, peeling occurred in the central portions and on the edges.

In addition, in Example Nos. 11 and 12, after etching was performed under a high temperature by using a hard mask, a check of capacitor omission inside an effective shot using a defect checking apparatus, a check of capacitor omission and a check of capacitor peeling outside an effective short using an optical microscope were performed. The results are shown in Table 3. In Table 3, the denominator is the number of checked semiconductor substrates, and the numerator is the number of semiconductor substrates in which peeling or capacitor omission occurred. Capacitor omission means that the top electrode or the ferroelectric film of the capacitor completely peels off and disappears. Also, in the capacitor omission check, the state of partial peeling (not complete peeling) occurring in any of the films composing the capacitor was observed. Furthermore, capacitor omission outside an effective shot is a defect occurring during wet processing for removing the TiN film serving as the hard mask, and capacitor peeling is a defect occurring before the wet processing. Also, "inside an effective shot" indicates a central portion of the wafer in which a predetermined rectangular region was ensured, and "outside effective shot" is a peripheral portion of the wafer in which the predetermined rectangular region was not ensured. Note that an object of the capacitor peeling check was a capacitor having a side of 200 μm in a plan view.

As shown in Table 3, no defect occurred in any check in Example No. 11. On the other hand, in Example No. 12, capacitor peeling occurred before the wet processing, and capacitor omission outside an effective shot occurred after the wet processing. These results show that the formation of the Ir adhesion film is most effective.

Furthermore, as a test of capacitor switching characteristics, the present inventors measured a switching charge amount Qsw when the lowermost wirings were formed, in each of Example Nos. 11 and 12. In this measurement, the switching voltage was set at 1.8 V and 3.0 V. The results are shown in FIG. 6.

Figure 6:
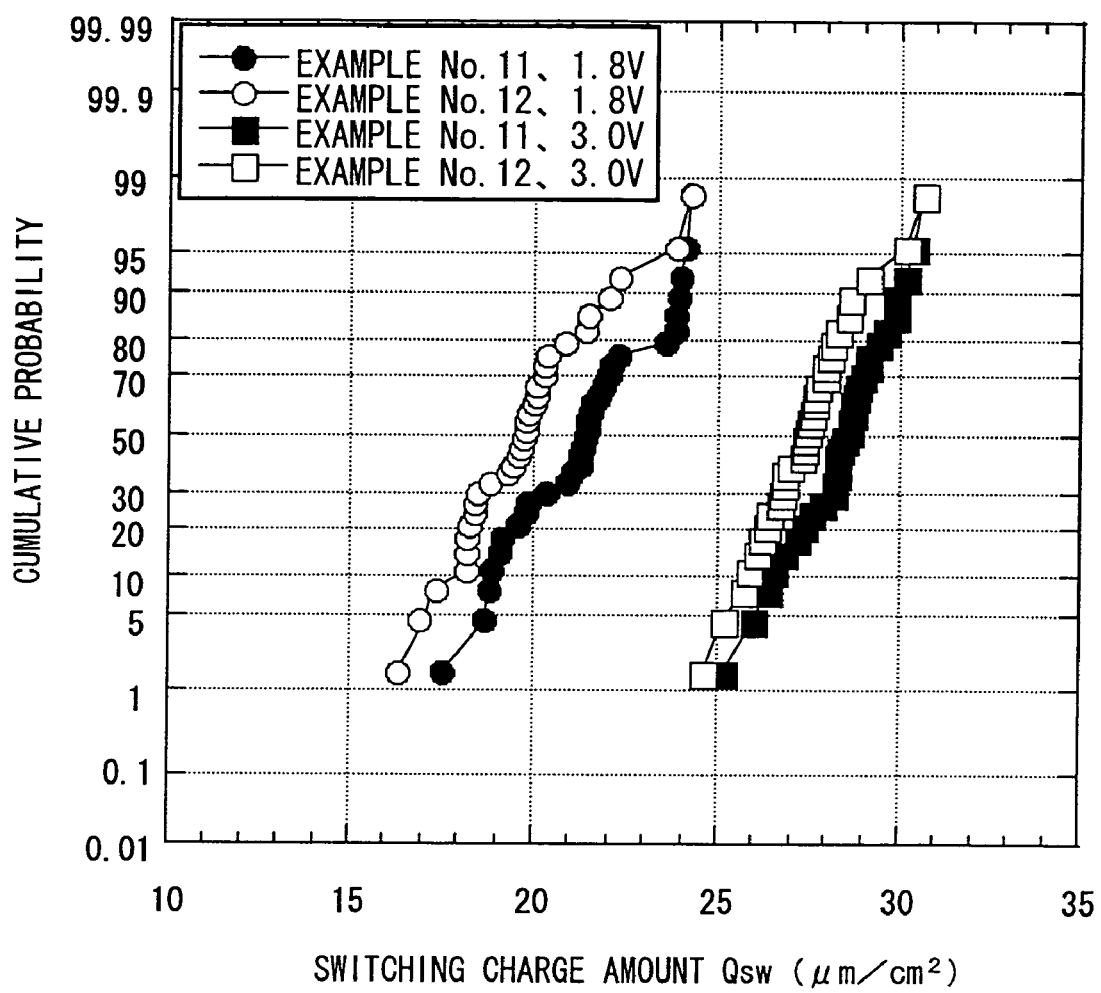
FIG. 6 is a graph showing the results of testing of the switching characteristics.

As shown in FIG. 6, a switching charge amount higher by about 1 μm/cm$^2$ than that of Example No. 12 was obtained in Example No. 11. This indicates that the Ir adhesion film presumably has no side-effect of a catalyst.

Third Embodiment

A third embodiment of the present invention will be described next. In the first and second embodiments, the present invention is applied to a ferroelectric capacitor having the stack structure. In the third embodiment, the present invention is applied to a ferroelectric capacitor having the planar structure.

To suppress the increase in capacitor area, the top electrode film and the ferroelectric film may be simultaneously etched in the ferroelectric capacitor having the planar structure as well. This simultaneous etching generally uses a single TiN film, a single SiON film, a single SiN film, a single TEOS film or the like as a hard mask. Therefore, as in the ferroelectric capacitor having the stack structure, film peeling or capacitor omission readily occurs when, for example, the hard mask is formed, or the hard mask is removed after simultaneous etching is performed.

Figure 7:
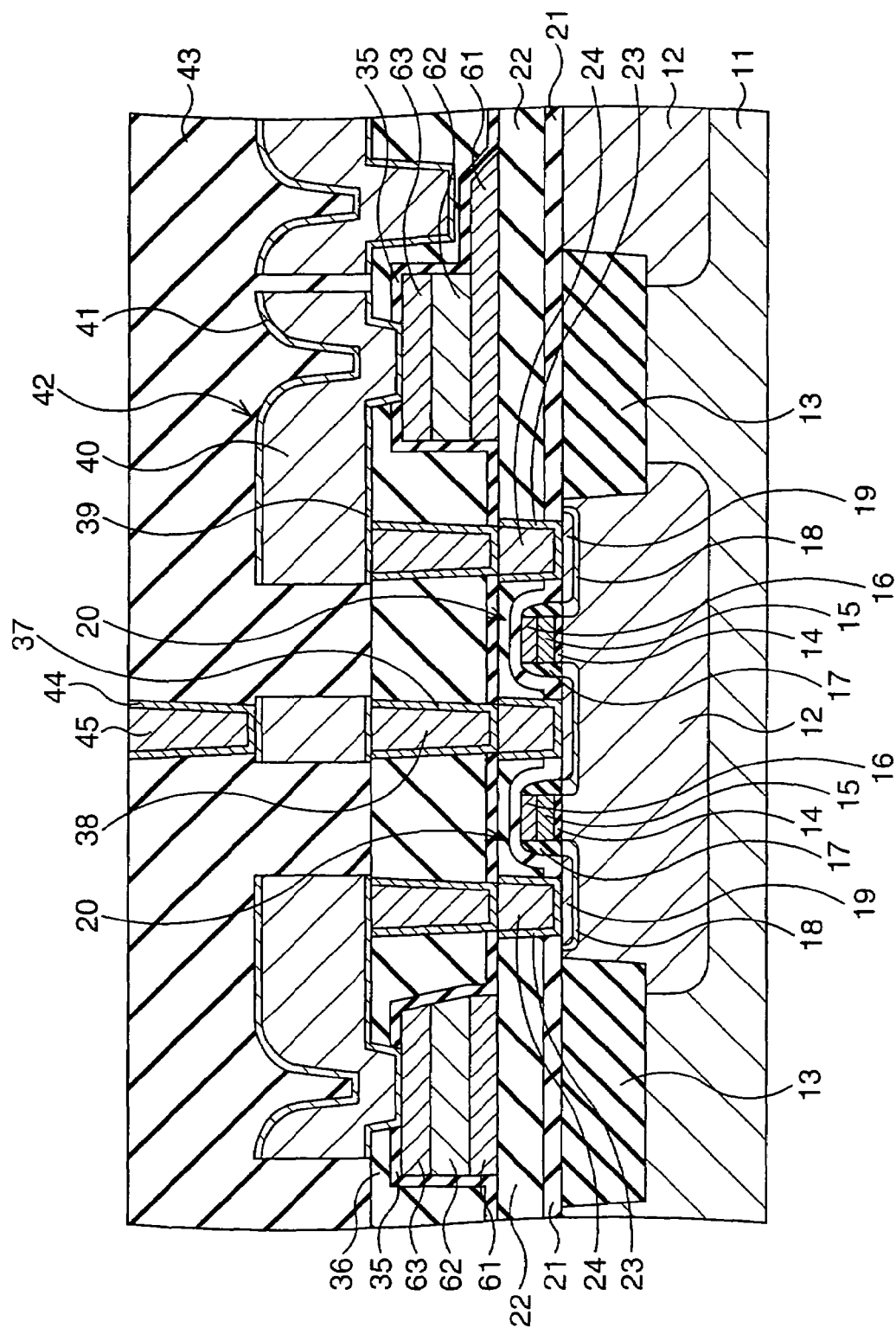
FIG. 7 is a sectional view showing a method for fabricating a ferroelectric memory (semiconductor device) according to a third embodiment of the present invention.

This embodiment solves the problem. FIG. 7 is a sectional view showing a method for fabricating a ferroelectric capacitor (semiconductor device) according to the third embodiment of the present invention. Note that FIG. 7 shows a section perpendicular to the direction in which the bit lines 3 run.

In the third embodiment, as shown in FIG. 7, processing from the formation of a well 12 to the formation of W plugs 24 is first performed in the same manner as in the first embodiment.

Then, a bottom electrode adhesion film and a Pt film (not shown) are sequentially formed on the entire surface. The bottom electrode adhesion film and the Pt film (bottom electrode film) are formed by, for example, sputtering. The bottom electrode adhesion film, for example, is formed at 20° C. and has a thickness of about 20 nm. Also, the Pt film, for example, is formed at 100° C. and has a thickness of about 175 nm. As the bottom electrode adhesion film, it is possible to use, for example, a Ti film, TiO$_x$ film, Al$_2$O$_3$ film or the like. Then, bottom electrodes 61 are formed by patterning the bottom electrode adhesion film and the Pt film.

A ferroelectric film (PLZT film, for example) (not shown) is then formed on the Pt film (bottom electrode film) by sputtering. After that, the PLZT film is annealed in an Ar or O$_2$ atmosphere at 600° C. or more by RTA (Rapid Thermal Annealing). As a consequence, the ferroelectric film crystallizes, and the density of the Pt film as the bottom electrode film increases. This suppresses interdiffusion of Pt and O near the interface between the Pt film and the ferroelectric film.

After that, a top electrode film (not shown) about 200 nm thick made of IrO$_2$ is formed on the crystallized ferroelectric film by sputtering.

Subsequently, the back surface of a semiconductor substrate (wafer) 11 is cleaned.

Then, an Ir adhesion film (not shown) is formed on the top electrode film. This Ir adhesion film, for example, is formed at a substrate temperature of 400° C. and has a thickness of about 10 nm. As in the first embodiment, a TiN film and a TEOS film are sequentially formed as a hard mask for simultaneous etching. The TiN film and the TEOS film are then patterned.

The top electrode film and the ferroelectric film are simultaneously etched to form capacitor dielectrics film 62 made of the ferroelectric film, and top electrodes 63 made of the Pt film. Then, the hard mask is removed. After that, recovery annealing (650° C., 60 min, in an oxygen atmosphere) is performed.

Processing from the formation of an alumina film 35 is performed in the same manner as in the first embodiment, thereby completing the ferroelectric memory having ferroelectric capacitors.

In the third embodiment as described above, peeling of the hard mask can be prevented even when ferroelectric capacitors having the planar structure are to be fabricated.

Note that the mask adhesion film is not limited to the Ir film, and it is also possible to use, for example, an Ru film, an Rh film, or a Pd film, or to use an oxide film of these elements.

Note also that the materials of the top electrode film and the bottom electrode film are not limited. As the top electrode film, it is possible to use an oxide film of, for example, Ir, Ru, Pt, Rh, or Pd, or a layered structure of these oxide films. It is also possible to use a layered structure obtained by forming an SrRuO$_3$ film on these oxide films.

In addition, the temperature of simultaneous etching is preferably room temperature or a higher temperature.

A Ti film may also be used, instead of the TiN film, as a part of the hard mask.

Furthermore, as the ferroelectric film, it is also possible to use a PZT (Pb(Zr,Ti)O$_3$) film, a compound film having a perovskite structure, for example, a film formed by adding a slight amount of Ca, Sr, or Si to the PZT film, or a compound film having a Bi-layer-based structure, for example, SBT ($SrBi_2Ta_2O_9$), instead of the PLZT film. Also, the ferroelectric film formation method is not particularly limited, and it is possible to form a ferroelectric film by, for example, a sol-gel method, a sputtering method, or an MOCVD method.

INDUSTRIAL APPLICABILITY

As has been explained in detail above, the present invention can prevent peeling and capacitor omission when a hard mask is formed. Accordingly, a ferroelectric capacitor having the stack structure suitable for micropatterning can be fabricated at a high yield.

TABLE 1

| Sample | Peeling in central portion | Peeling on edge |
|---|---|---|
| Example No. 1 | 0/40 | 0/40 |
| Example No. 2 | 0/10 | 10/10 |
| Example No. 3 | 0/7 | 0/7 |
| Comparative Example No. 4 | 40/40 | 40/40 |
| Comparative Example No. 5 | 4/13 | 2/13 |

TABLE 2

| Sample | Peeling in central portion | Peeling on edge |
|---|---|---|
| Example No. 11 | 0/40 | 0/40 |
| Example No. 12 | 0/7 | 0/7 |
| Comparative Example No. 13 | 30/30 | 30/30 |

TABLE 3

| Sample | Defect checking apparatus Capacitor omission inside effective shot | Optical microscope | |
|---|---|---|---|
| | | Capacitor omission outside effective shot | Capacitor peeling |
| Example No. 11 | 0/2 | 0/2 | 0/4 |
| Example No. 12 | 0/2 | 1/1 | 3/3 |

What is claimed is:

1. A method for fabricating a semiconductor device comprising the steps of:
    forming a ferroelectric film as a material film of a capacitor dielectric film of a ferroelectric capacitor above a semiconductor substrate;
    forming a top electrode film as a material film of a top electrode of the ferroelectric capacitor on the ferroelectric film;
    forming a mask adhesion film containing a noble metal element on the top electrode film;
    forming a hard mask on the mask adhesion film; and
    etching the top electrode film and the ferroelectric film by using the hard mask,
    wherein the step of forming the hard mask comprises the steps of:
    forming a Ti or TiN film on the mask adhesion film;
    forming a tetraethylorthosilicate film on the Ti or TiN film; and
    patterning the Ti or TiN film and the tetraethylorthosilicate film.

2. The method for fabricating a semiconductor device according to claim 1, further comprising the step of cleaning a back surface of the semiconductor substrate, between the step of forming the top electrode film and the step of forming the mask adhesion film.

3. The method for fabricating a semiconductor device according to claim 1, wherein the step of forming the mask adhesion film comprises the step of heating the semiconductor substrate to not less than 400° C.

4. The method for fabricating a semiconductor device according to claim 2, wherein the step of forming the mask adhesion film comprises the step of heating the semiconductor substrate to not less than 400° C.

5. The method for fabricating a semiconductor device according to claim 1, further comprising the step of forming a bottom electrode film as a material film of a bottom electrode of the ferroelectric capacitor above the semiconductor substrate, before the step of forming the ferroelectric film,
    wherein the ferroelectric film is formed on the bottom electrode film.

6. The method for fabricating a semiconductor device according to claim 2, further comprising the step of forming a bottom electrode film as a material film of a bottom electrode of the ferroelectric capacitor above the semiconductor substrate, before the step of forming the ferroelectric film,
    wherein the ferroelectric film is formed on the bottom electrode film.

7. The method for fabricating a semiconductor device according to claim 5, wherein, in the step of etching the top electrode film and the ferroelectric film, the bottom electrode film is also etched by using the hard mask.

8. The method for fabricating a semiconductor device according to claim 6, wherein, in the step of etching the top electrode film and the ferroelectric film, the bottom electrode film is also etched by using the hard mask.

9. The method for fabricating a semiconductor device according to claim 1, wherein one film selected from the group consisting of an Ir film, an Ru film, an Rh film, and a Pd film is formed as the mask adhesion film.

10. The method for fabricating a semiconductor device according to claim 1, wherein an oxide film of one element selected from the group consisting of Ir, Ru, Rh, and Pd is formed as the mask adhesion film.

11. The method for fabricating a semiconductor device according to claim 1, wherein a conductive film containing a noble metal oxide is formed as the top electrode film.

12. The method for fabricating a semiconductor device according to claim 2, wherein a conductive film containing a noble metal oxide is formed as the top electrode film.

13. The method for fabricating a semiconductor device according to claim 11, wherein an oxide of one element selected from the group consisting of Ir, Ru, Pt, Rh, and Pd is formed as the noble metal oxide.

14. The method for fabricating a semiconductor device according to claim 12, wherein an oxide of one element selected from the group consisting of Ir, Ru, Pt, Rh, and Pd is formed as the noble metal oxide.

15. The method for fabricating a semiconductor device according to claim 1, wherein a compound film having a perovskite structure or a compound film having a Bi-layer-based structure is formed as the ferroelectric film.

16. A method for fabricating a semiconductor device according to claim 2, wherein a compound film having a perovskite structure or a compound film having a Bi-layer-based structure is formed as the ferroelectric film.

17. A method for fabricating a semiconductor device comprising the steps of:

forming a ferroelectric film as a material film of a capacitor dielectric film of a ferroelectric capacitor above a semiconductor substrate;

forming a top electrode film as a material film of a top electrode of the ferroelectric capacitor on the ferroelectric film;

heating the semiconductor substrate to not less than 400° C. after forming the top electrode so as to clean carbon on the top electrode film;

forming a hard mask on the top electrode film; and etching the top electrode film and the ferroelectric film by using the hard mask, wherein the step of forming the hard mask comprises the steps of:

forming a Ti or TiN film on the top electrode film;

forming a tetraethylorthosilicate film on the Ti or TiN film; and patterning the Ti or TiN film and the tetraethylorthosilicate film.

* * * * *